United States Patent
Chang et al.

(10) Patent No.: US 8,929,154 B2
(45) Date of Patent: Jan. 6, 2015

(54) LAYOUT OF MEMORY CELLS

(75) Inventors: Jacklyn Chang, San Ramon, CA (US); Derek C. Tao, Fremont, CA (US); Yukit Tang, San Jose, CA (US); Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 728 days.

(21) Appl. No.: 13/267,235

(22) Filed: Oct. 6, 2011

(65) Prior Publication Data

US 2013/0088925 A1    Apr. 11, 2013

(51) Int. Cl.
  *G11C 7/10*    (2006.01)
  *G11C 7/18*    (2006.01)
  *H01L 27/02*   (2006.01)
  *G11C 11/412*  (2006.01)
  *G11C 11/413*  (2006.01)
  *H01L 27/11*   (2006.01)

(52) U.S. Cl.
  CPC .............. *G11C 7/18* (2013.01); *H01L 27/0207* (2013.01); *G11C 11/412* (2013.01); *G11C 11/413* (2013.01); *H01L 27/1104* (2013.01)
  USPC ................... 365/189.03; 365/63; 365/185.05; 365/185.2

(58) Field of Classification Search
  CPC ......... G11C 7/12; G11C 7/18; G11C 11/4096
  USPC ........ 365/189.03, 63, 185.05, 185.2
  See application file for complete search history.

(56) References Cited

U.S. PATENT DOCUMENTS

| 6,462,584 | B1 * | 10/2002 | Proebsting | 327/52 |
| 6,462,998 | B1 * | 10/2002 | Proebsting | 365/205 |
| 2003/0218901 | A1 * | 11/2003 | Ooishi et al. | 365/157 |

* cited by examiner

*Primary Examiner* — Tuan T Nguyen
(74) *Attorney, Agent, or Firm* — Lowe Hauptman & Ham, LLP

(57) ABSTRACT

A semiconductor structure includes a first strap cell, a first read port, and a first VSS terminal. The first strap cell has a first strap cell VSS region. The first read port has a first read port VSS region, a first read port read bit line region, and a first read port poly region. The first VSS terminal is configured to electrically couple the first strap cell VSS region and the first read port VSS region.

20 Claims, 11 Drawing Sheets

LAYOUT OF MEMORY CELLS

FIELD

The present disclosure is related to layout of memory cells.

BACKGROUND

Layouts of circuit elements in integrated circuits can greatly affect performance and die areas of the circuits. For example, a non-optimized layout can result in a circuit having additional circuitry and/or additional loads to other circuits. The additional circuitry increases the die area of the total circuits. In some situations, the additional loads degrade the read speed of a memory macro.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
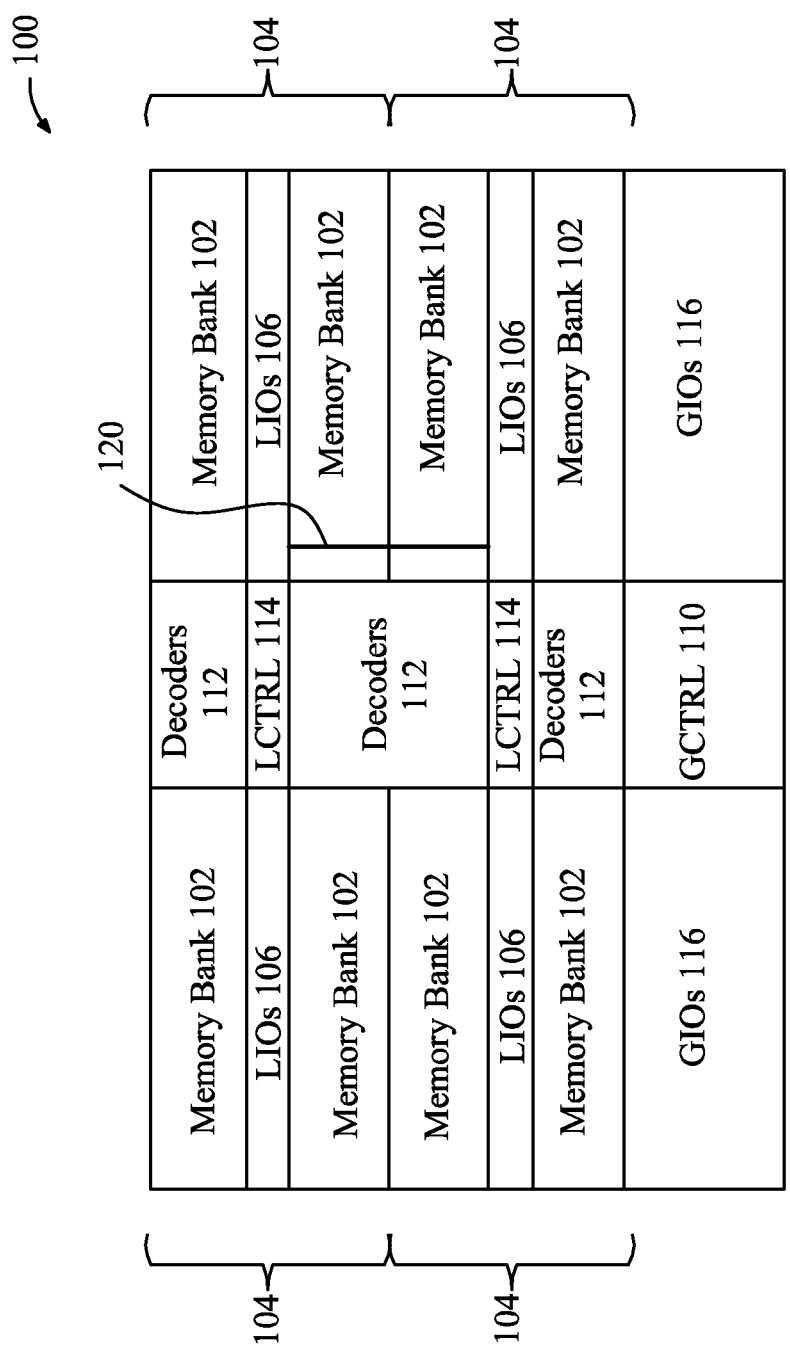
FIG. 1 is a diagram of a memory macro, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. The reference voltage (VSS) region of a strap cell and the VSS region of a bit cell in a column of a memory macro share the same first VSS contact terminal. The VSS region of a read port in an upper segment and the VSS region of a second read port in a lower segment share the same second VSS contact terminal. As a result, well strap cells between the upper segment and the lower segment in the memory macro are not needed. Consequently, the die area for the memory macro is reduced, the load for the read bit line is less, and the read speed is improved.

Exemplary Memory Macro

FIG. 1 is a block diagram of a memory macro 100, in accordance with some embodiments.

Memory macro 100 includes a plurality of memory segments 104. Four segments 104 are shown for illustration. A different number of memory segments 104 is within the scope of various embodiments. Each segment 104 includes two memory banks 102 sharing a row of a plurality of local input/output circuitries (LIOs) 106. Different configurations of a memory segment 104 are within the scope of various embodiments. Each memory bank 102 includes a plurality of memory cells 122 (shown in FIG. 2) arranged in columns and rows. A column 120 is shown for illustration and is described in details in FIG. 5.

Address decoders 112 provide the X- or row-address of memory cells 122 to be accessed for a read or a write operation of a memory cell in memory macro 100.

Local control circuits (LCTRL) 114 control LIOs 106, including, for example, turning on and off the read word lines and write word lines of the LIOs 106.

Global input/outputs (GIOs) 116 serve to transfer data between the memory cells and other circuits outside of memory macro 100.

Global control circuit (GCTRL) 110 provides the address pre-decode, clock, and other signals for memory macro 100. GCTRL 110 includes a Y-decoder (not shown) that provides the Y- or column address of a memory cell.

Exemplary Memory Cell

Figure 2:
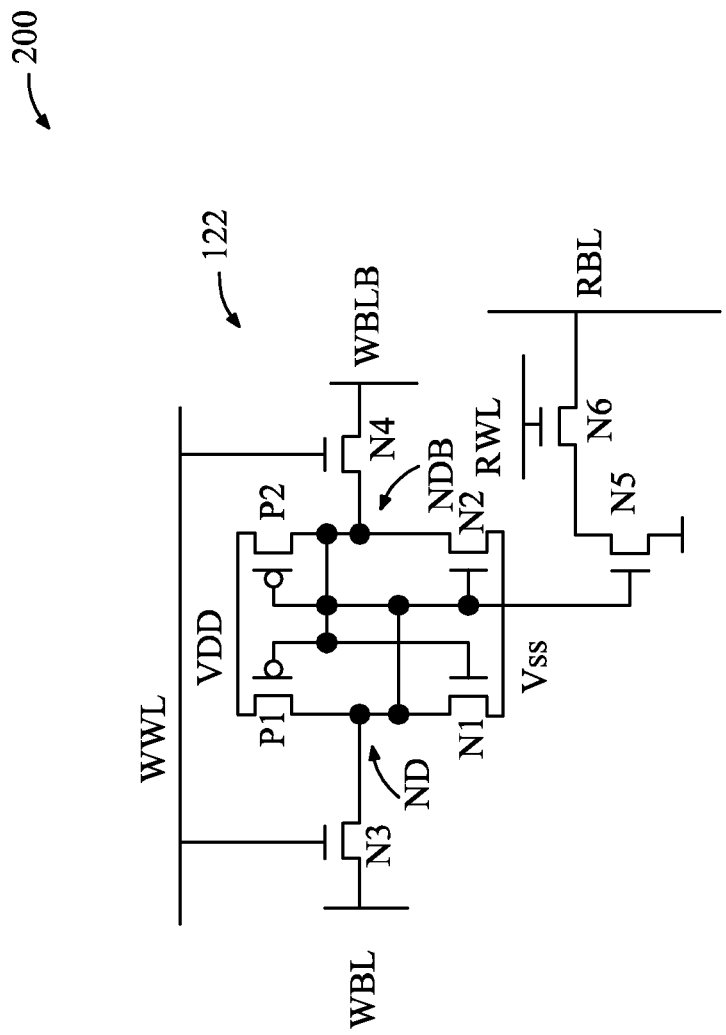
FIG. 2 is a diagram of a memory cell, in accordance with some embodiments.

FIG. 2 is a circuit diagram of a memory cell 122, in accordance with some embodiments. Memory cell 122 includes two P-type metal oxide semiconductor (PMOS) transistors P1 and P2, and six N-type metal oxide semiconductor (NMOS) transistors N1, N2, N3, N4, N5, and N6.

The gates of NMOS transistors N3 and N4 are coupled to a write word line WWL. A write word line WWL is coupled to the gates of transistors N3 and N4 of a plurality of memory cells 122 to a form a row of memory cells.

The gate of transistor N6 is coupled to a read word line RWL. A read word line RWL is coupled to each gate of transistors N6 of the plurality of memory cells 122 that are coupled to a corresponding write word line WWL.

The drain of transistor N6 is coupled to a read bit line RBL. Read bit line RBL is coupled to the drains of a plurality of transistors N6 of a plurality of memory cells 122 to form a column, such as a column 120 shown in FIG. 1.

The drains of transistors N3 and N4 are coupled to a pair of write bit lines WBL and WBLB, respectively. The pair of write bit lines WBLA and WBLB is coupled to the drains of transistors N3 and N4 of the plurality of memory cells 122 that are coupled to the corresponding read bit line RBL.

In a write operation for a memory cell 122, write word line WWL is activated. The logic values to be written to memory cell 122 are placed at write bit lines WBL and WBLB and are then transferred or stored at nodes ND and NDB at the sources of transistors N3 and N4, respectively.

In a read operation, read word line RWL is activated to turn on transistor N6. Detecting the voltage value at read line RBL reveals the data stored in nodes NDB and ND.

Transistor N5, transistor N6, a read word line RWL, and a read bit line RBL are collectively called a read port of a memory cell 122.

Exemplary Read Port Layouts

Figure 3:
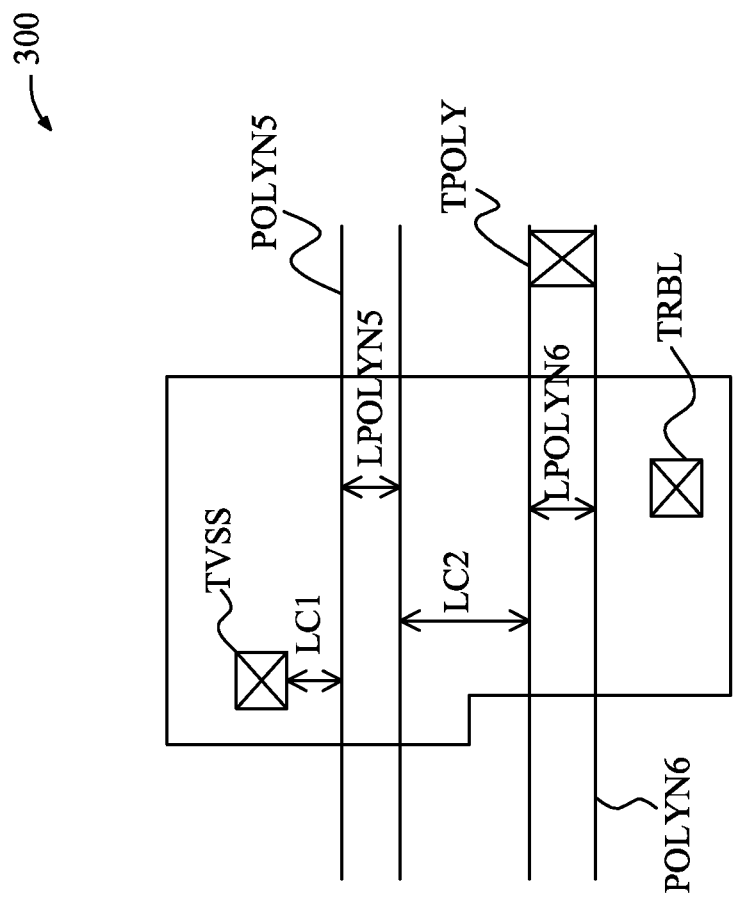
FIG. 3 is a diagram representing a read port of a memory cell, in accordance with some embodiments.

FIG. 3 is a diagram of a layout of a read port (RPRT) 300 of a memory cell 122, in accordance with some embodiments. In terms of a layout, a read port 300 includes a first terminal TVSS, a second terminal TRBL, and a third terminal TPOLY. Terminal TVSS is formed on a source region of transistor N5. Terminal TRBL is formed on a drain region of transistor N6. For simplicity, the source region of transistor N5 and the drain region of transistor N6 are not shown in FIG. 3. Terminal TPOLY is formed on the gate or the poly region POLYN6 of transistor N6. Region POLYN5 represents the gate or the poly region of transistor N5.

For illustration, length LC1 is the distance between terminal TVSS and poly region POLYN5. Length LC2 is the distance between poly regions POLYN5 and POLYN6. Lengths LPOLYN5 and LPOLYN6 are the widths of poly regions POLYN5 and POLYN6, respectively. In various embodiments, each of lengths LC1, LC2, LPOLYN5 and LPOLYN6 has the same length with a corresponding length of strap cell 124, which is explained in FIG. 4C. In various embodiments, each of lengths LC1, LC2, LPOLYN5 and LPOLYN6 has a different length.

In some embodiment, a terminal TVSS of a read port 300 is merged into a neighboring terminal TVSS of a strap cell or of another read port 300 in the same column. Explained in a different way, the strap cell and the neighboring read port or two neighboring read ports in a column share the same terminal TVSS. For example, in a column 120, if a read port 300 neighbors a strap cell 124, the terminal TVSS of the read port 300 is merged into a terminal TVSS of the strap cell 124. But if the read port 300 neighbors another read port 300, then the terminals TVSS of two neighboring read ports 300 are merged into one terminal TVSS. Terminals TRBL of two neighboring read ports 300 in a column are also merged. In contrast, terminals TPOLY of a pair of two neighboring read ports 300 in a row are not merged.

In some embodiments, terminals TVSS of read ports 300 in a column are electrically coupled together and to a node configured to receive a reference voltage VSS. Terminals TPOLY of transistors N6 in a row of memory cells 120 are electrically coupled together and to a read word line RWL. Terminals TRBL of read ports 300 in a column in a first segment are electrically coupled together and to a first read bit line RBL. Terminal TRBL of read ports 300 in the same column in a second segment are electrically coupled together and to a second read bit line RBL. In some embodiments, a metal line in a metal one layer serves as a read bit line RBL. Further, a metal one layer is a first metal layer above an active or a diffusion layer of a semiconductor structure. A metal two layer is above a metal one layer. A metal three layer is above a metal two layer. A metal four layer is above a metal three layer, etc.

Figure 4A:
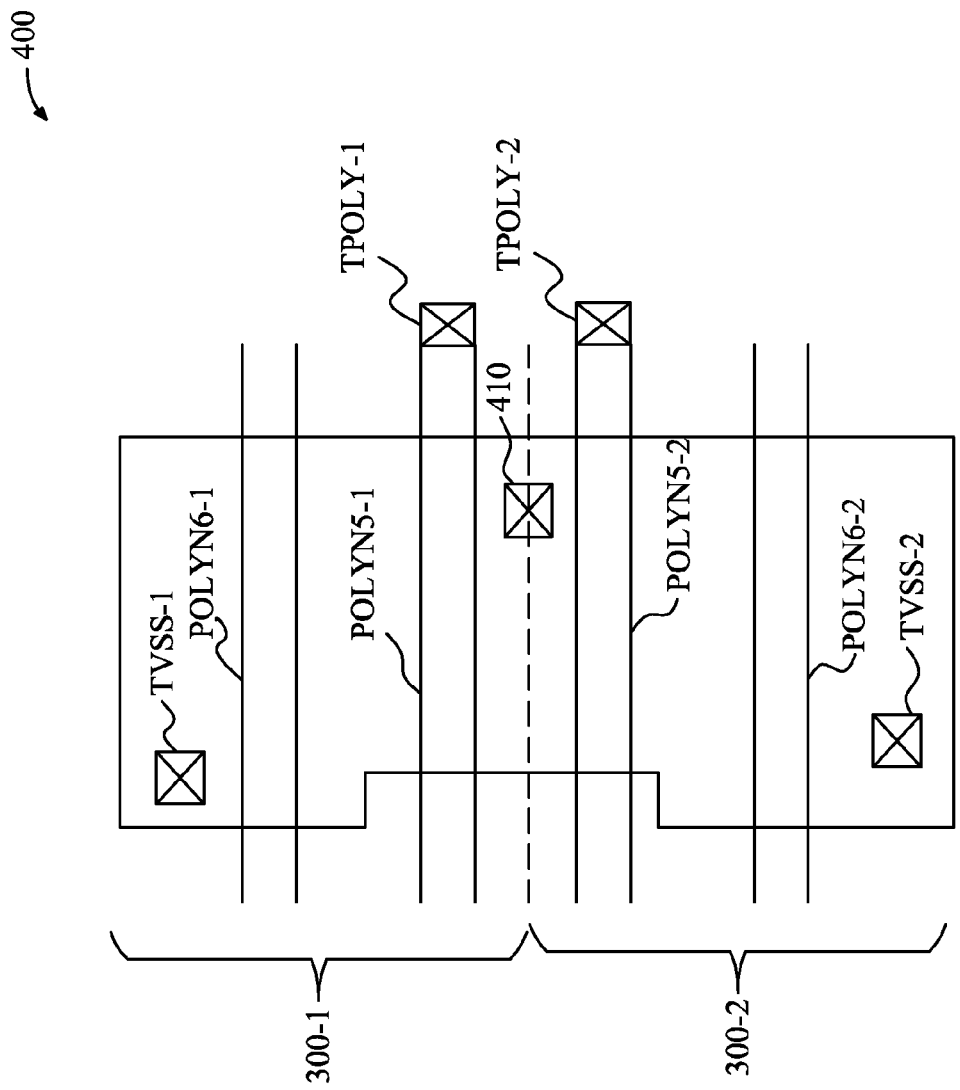
FIG. 4A is a diagram of two read ports connected in the column direction, using a shared terminal, in accordance with some embodiments.

FIG. 4A is a diagram of a pair of read ports 400 illustrating how two memory cells 122 are electrically coupled together in the context of two read ports 300-1 and 300-2, in accordance with some embodiments. Names of elements of read port 300-1 are labeled with "-1," while names of elements of read port 300-2 are labeled with "-2." In FIG. 4A, each of a read port 300-1 and 300-2 corresponds to a memory cell 122 (not shown in FIG. 4A). Additionally, terminals TRBL of read ports 300-1 and 300-2 are merged as one read bit line terminal and are labeled terminal 410. Explained in a different way, two neighboring read ports 300-1 and 300-2 in a column share the same read bit line terminal 410.

Figure 4B:
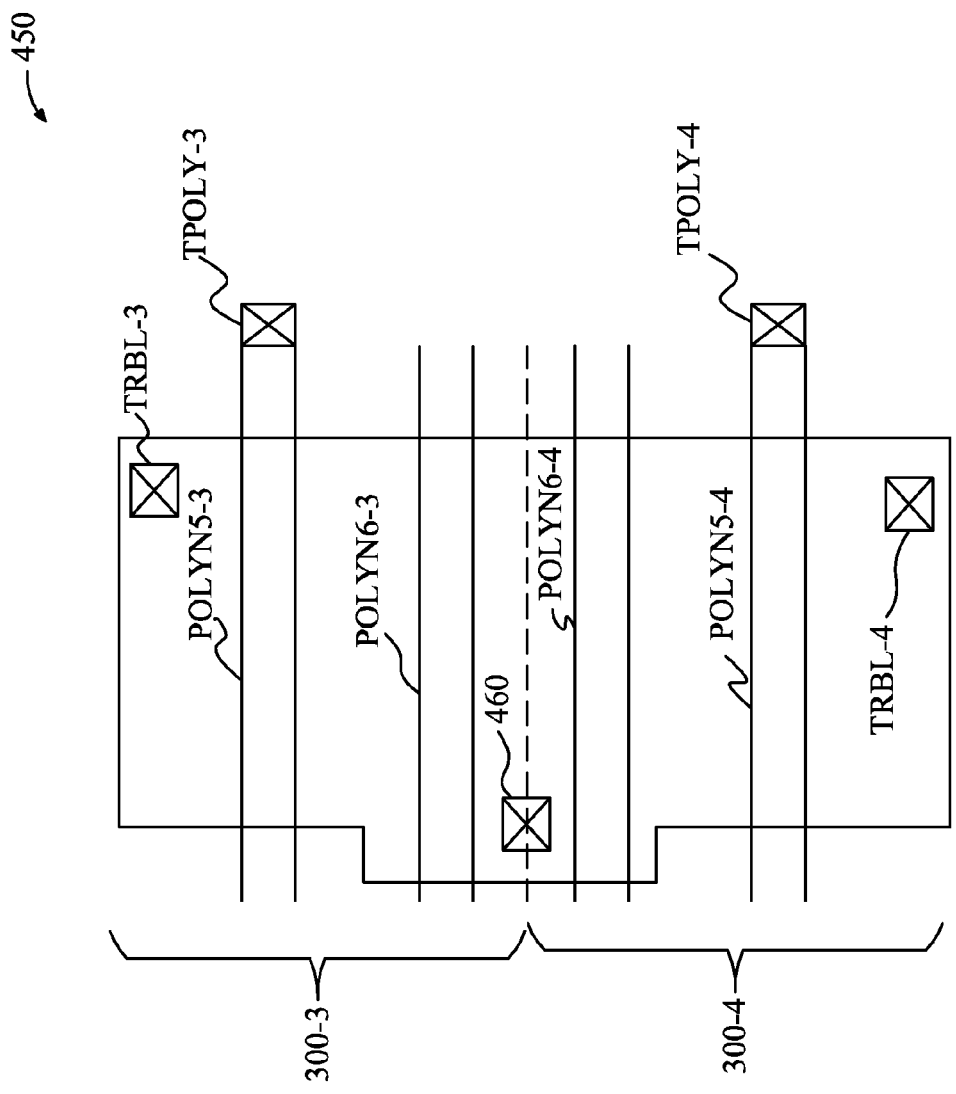
FIG. 4B is a diagram of two read ports connected in the column direction, using a different shared terminal, in accordance with some embodiments.

FIG. 4B is a diagram of a pair of read ports 450 illustrating how two memory cells 122 are electrically coupled together, and share the same terminal TVSS, in accordance with some embodiments. Names of elements of read port 300-3 are labeled with "-3," while names of elements of read port 300-4 are labeled with "-4." In FIG. 4B, terminals TVSS of read ports 300-3 and 300-4 are merged as one terminal, and are labeled terminal 460. Explained in a different way, two neighboring read ports 300-3 and 300-4 share a terminal TVSS 460.

In some embodiments, a first read port 300 shares the same TRBL terminal with a second read port 300 in the same column and/or shares the same TVSS terminal with a third read port 300 in the same column.

Figure 4C:
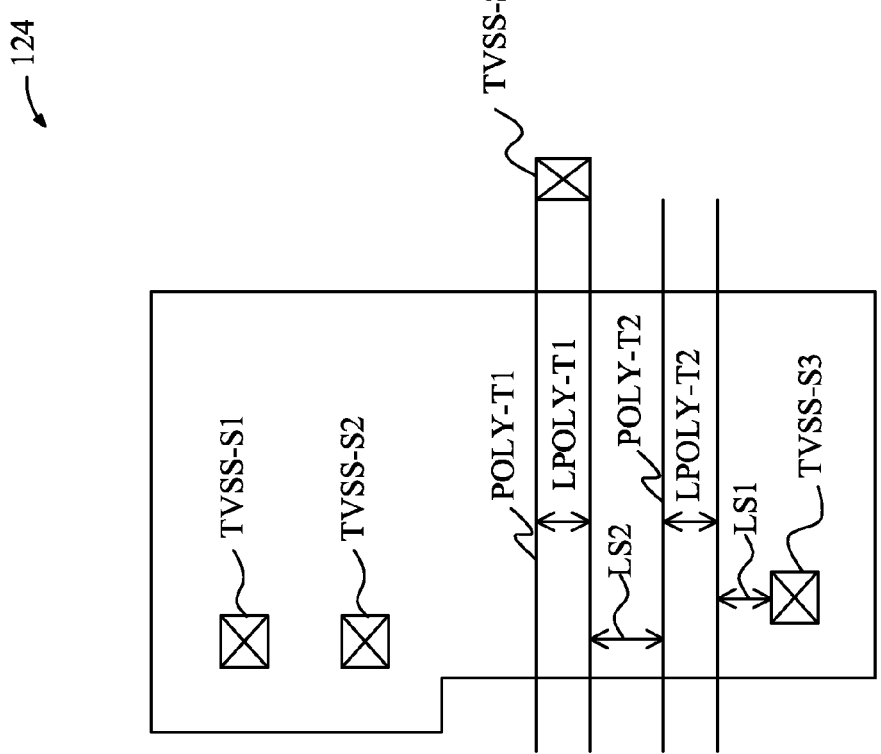
FIG. 4C is a diagram of a strap cell, in accordance with some embodiments.

FIG. 4C is a diagram of a strap cell 124, in accordance with some embodiments. A strap cell is commonly placed at a boundary of a memory array to protect the memory cells 122 inside the boundary. In some embodiments, a strap cell 124 includes two transistors represented by two poly gate regions POLY-T1 and POLY-T2. Strap cell 124 includes three terminals TVSS, which are labeled TVSS-S1, TVSS-S2, and TVSS-S3. In addition, poly region POLY-T1 includes a terminal TVSS-S4, which is formed on poly region POLY-T1. In some embodiments, terminal TVSS-S4 is electrically coupled with other terminals TVSS in memory macro 100.

For illustration, length LS1 is the distance between terminal TVSS-S3 and poly region POLY-T2. Length LS2 is the distance between poly regions POLY-T1 and POLY-T2. Lengths LPOLY-T1 and LPOLY-T2 are the widths of poly regions POLY-T1 and POLY-T2, respectively. In some embodiments, lengths LS1, LS2, LPOLY-T2, and LPOLY-T1 have the same lengths as lengths LC1, LC2, LPOLYN5, and LPOLYN6 of read port 300 in FIG. 3. In some embodiments, lengths LS1, LS2, LPOLY-T2, and LPOLY-T1 have the different lengths than lengths LC1, LC2, LPOLYN5, and LPOLYN6 of read port 300 in FIG. 3.

Figure 4D:
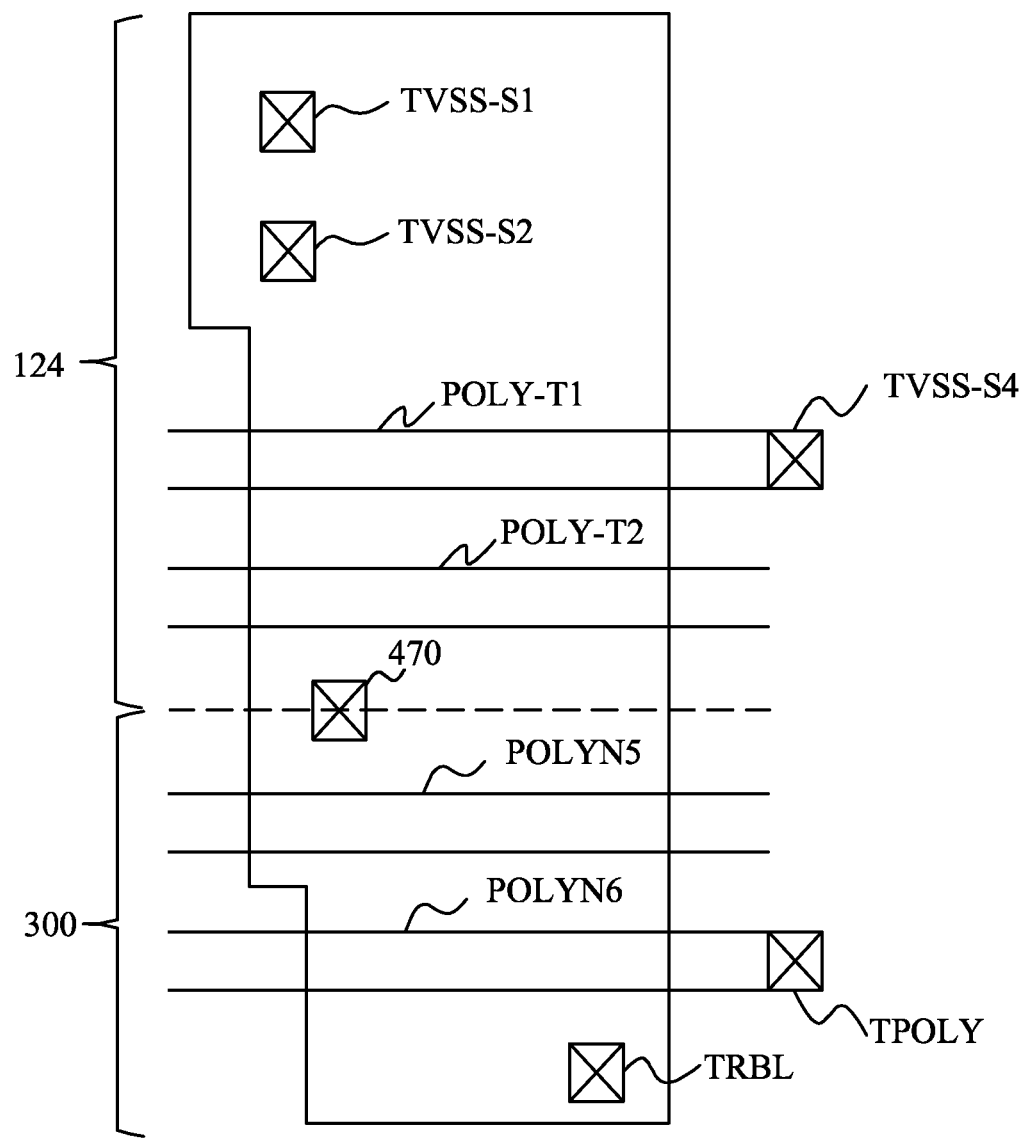
FIG. 4D is a diagram of a strap cell and a read port connected in the column direction, in accordance with some embodiments.

FIG. 4D is a diagram used to illustrate a connected strap cell and read port 475 and how a strap cell 124 and a read port 300 in a column are connected, in accordance with some embodiments. In FIG. 4D, terminal TVSS-S3 of strap cell 124 is merged with terminal TVSS of read port 300 as one terminal TVSS labeled 470. Explained differently, a strap cell 124 and a read port 300 share the same TVSS terminal 470. In some embodiments, a column 120 includes two strap cells 124 at two edges of column 120. A first strap cell 124 at the first edge of the column shares a first terminal TVSS with a first neighboring read port 300, and a second strap cell 124 at the second edge of the column shares a second terminal TVSS with a second neighboring read port 300.

Figure 5:
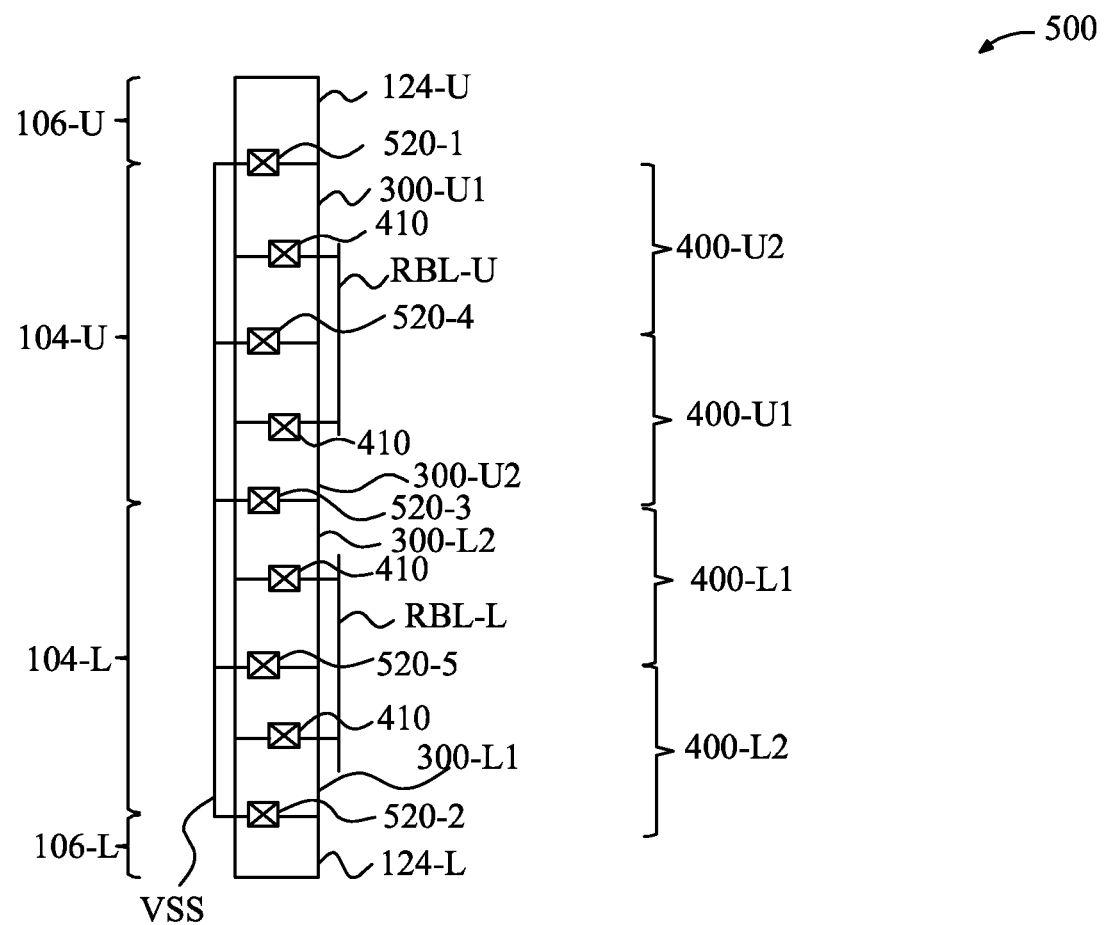
FIG. 5 is a diagram of a column of read ports and strap cells, in accordance with some embodiments.

FIG. 5 is a diagram of a column 120 in FIG. 1, in accordance with some embodiments. Column 120 is shown in the context of read ports 300 of memory cells 122. In FIG. 5, a read port 300 represents a memory cell 122. For simplicity, terminal TPOLY, poly region POLYN5, and poly region POLYN6 of read ports 300 are not shown. Further, a reference to a column of memory cells 122 also refers to a column of read ports 300 and vice versa.

For illustration, column 120 includes four read ports 300 in upper segment 104-U and four read ports 300 in lower segment 104-L. Effectively, column 120 includes two pairs of read ports 400-U1 and 400-U2 in upper segment 104-U and two pairs of read ports 400-L1 and 400-L2 in lower segment 104-L. A different number of pairs of read ports 400, a different number of read ports, and, thus, a different number of memory cells 122 in each of an upper and a lower segment is within the scope of various embodiments.

Column 120 also includes an upper LIO 106-U and a lower LIO 106-L. Upper LIO 106-U includes a strap cell 124-U while lower LIO 106-L includes a strap cell 124-L.

In some embodiments, the terminal TVSS of a strap cell in column 120 is merged with the terminal TVSS of a neighboring read port 300 in the same column 120. For example, in FIG. 5, terminal TVSS of strap cell 124-U is merged with terminal TVSS of read port 300-U1 as one terminal, and is labeled VSS contact terminal 520-1. In other words, a VSS region of strap cell 124-U and a VSS region of read port 300-U1 share the same VSS contact terminal 520-1. Similarly, terminal TVSS of strap cell 124-L is merged with terminal TVSS of read port 300-L1 as one terminal and is labeled terminal 520-2. Effectively, a VSS region of strap cell 124-L and a VSS region of read port 300-L1 share the same VSS contact terminal 520-2. The connection between a strap cell and a read port sharing a terminal TVSS is illustrated above with reference to FIG. 4D. Additionally, a terminal TVSS of a pair of read reports 400 is merged with another terminal TVSS of another pair of read ports 400. In FIG. 5, the shared TVSS terminals are labeled terminals 520-3, 520-4, and 520-5. Two pairs of read ports 400 sharing the same TVSS terminal are similar to two read ports 300 sharing the same terminal TVSS, which is explained above with reference to FIG. 4B.

In some embodiments, a terminal TVSS 520 is formed by metals on the corresponding diffusion area of the corresponding sources of transistors N5. Terminals 520-1 through 520-5 in column 120 are coupled together and to a reference voltage VSS line that is formed at a metal four layer. Electrical connections between terminals TVSS 520-1 through 520-5 on the diffusion area and the VSS line on the metal four layer are through metal one layer, metal two layer, metal three layer, and vias between the metal layers. For example, vias are used between the diffusion area and metal lines of the metal one layer, between metal lines of the metal one layer and of the metal two layer, between metal lines of the metal two layer and the metal three layer, and between metal lines of the metal three layer and metal four layer.

Each of a pair of read ports 400 includes a read bit line contact terminal 410 shared by two read bit line regions of the corresponding two read ports. Read bit line contact terminals 410 of the pairs of read ports 400-U1 and 400-U2 in upper segment 104-U are coupled together and to a read bit line RBL-U. Read bit line contact terminals 410 of the pairs of read ports 400-L1 and 400-L2 in lower segment 104-L are coupled together and to a read bit line RBL-L. In some embodiments, a metal line on the metal one layer is cut into two portions so that the first portion serves as a first read bit line and the second portion serves as a second read bit line. For example, a first portion of a metal line on the metal one layer serves as a read bit line RBL-U, and a second portion of the same metal one line serves as a read bit line RBL-L. In some embodiments, the number of read ports 300, and thus the number of memory cells 122, coupled to a read bit line is selected based on the value $2^K$ where K is an integer number. As a result, exemplary numbers of read ports 300 per read bit line include 4, 8, 16, 32, etc. Further, the number of read ports 300 per read bit line is an even number.

At the boundary of upper segment 104-U and of lower segment 104-L, the terminal TVSS of a read port 300 in the upper segment 104-U is merged with the TVSS terminal of a read port 300 in the lower segment 104-L. For example, in FIG. 5, terminal TVSS of read port 300-U2 is merged with terminal TVSS of read port 300-L2 as one contact terminal 520-3. In other words, read port 300-U2 and read port 300-L2 share the same TVSS terminal 520-3.

Because the terminals TVSS of read port 300-U2 at the boundary of segment 104-U and of read port 300-L2 at the boundary of segment 104-L share the same TVSS terminal 520-3, various embodiments of the disclosure do not need to use a strap cell between the upper segment and the lower segment. For example, various embodiments do not need to use a strap cell between segments 104-U and 104-L that have read port 300-U2 and read port 300-L2, respectively. Effectively, there is not a row of strap cells between an upper segment 104-U and a lower segment 104-L in memory macro 100. Consequently, the die area of memory macro 100 is reduced. An additional strap cell would operate as an additional load to column 120, and would degrade the read performance of memory cells in column 120 in some conditions. As a result, a column 120 without the additional strap cell in between segments 104-U and 104-L in accordance with various embodiments of the disclosure is advantageous.

Additionally, read ports 300 in upper segment 104-U use two shared TVSS terminals 520-1 and 520-4, and read ports 300 in lower segment 104-L use two shared TVSS terminals 502-2 and 520-5. Additional shared TVSS terminals 520 could be needed, if read ports 300 are arranged in a way different from the arrangement in FIG. 5. For example, additional TVSS shared terminals 520 would be needed if a strap cell 124 and the neighboring read port 300 share the same terminal TRBL.

Figure 6:
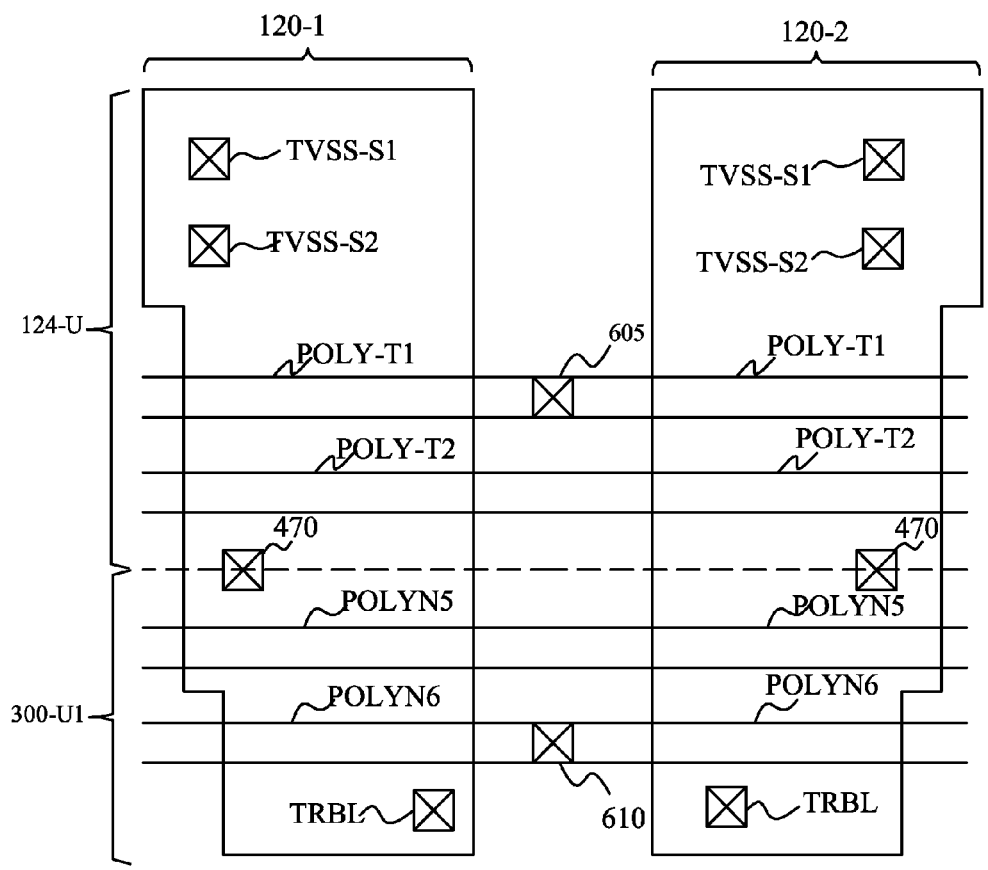
FIG. 6 is a diagram of two columns of read ports and strap cells, in accordance with some embodiments.

FIG. 6 is a diagram illustrating how two columns 120-1 and 120-2 are connected, in accordance with some embodiments. For illustration, a strap cell 124-U and a read port 300-U1 of each of column 120-1 and column 120-2 in upper segment 104-U are shown. Other read ports 300 in upper segment 104-U are not shown. Further, read ports 300 and strap cells 124-L of columns 120-1 and 120-2 in lower segment 104-L are not shown. Effectively, FIG. 6 shows the connection of two connected strap cells and read ports 475 shown in FIG. 4D.

Connections of other read ports 300 in upper segment 104-U, read ports 300, and strap cells 124-L of columns 120-1 and 120-2 in lower segment 104-L should be recognizable by persons of ordinary skill in the art in view of this disclosure.

In some embodiments, terminals TVSS-S4, as shown in FIG. 4D, of two neighboring strap cells 124-U in columns 120-1 and 120-2 are merged as one terminal used by both read ports. For example, terminals TVSS-S4 of strap cells 124-U of each column 120-1 and column 120-2 are merged as one TVSS contact terminal 605. In other words, strap cells 124-U of column 120-1 and column 120-2 share the same TVSS contact terminal 605.

In some embodiments, terminals TPOLY, as shown in FIG. 4D, of two neighboring read ports 300 in columns 120-1 and 120-2 are merged as one terminal used by both read ports. For example, terminals TPOLY of read ports 300-U1 of each column 120-1 and column 120-2 are merged as one poly contact terminal 610. In other words, read ports 300-U1 of columns 120-1 and column 120-2 share the same poly contact terminal 610.

In some embodiments, the poly contact terminal 610, by way of a first via from the poly region POLYN6 of read ports 300-U1 in columns 120-1 and 120-2 are electrically coupled to a metal line on the metal one layer. The metal line on the metal one layer, through a second via, is electrically connected to a metal line on the metal two layer. The poly contact terminal 610, by way of a third via from the metal line on the metal two layer is electrically coupled to a metal line on the metal three layer. Effectively, a metal line on the metal three layer serves as a read word line to electrically couple the gates of transistors N6 of read ports 300 in a row.

Connections of other additional columns 120-1 and 120-2 should be recognizable by persons of ordinary skill in the art in view of this disclosure. In various embodiments, a plurality of pairs of columns 102-1 and 120-2 illustratively shown in FIG. 6 are formed to form two segments 104-U and 104-L.

Exemplary Methods

Figure 7:
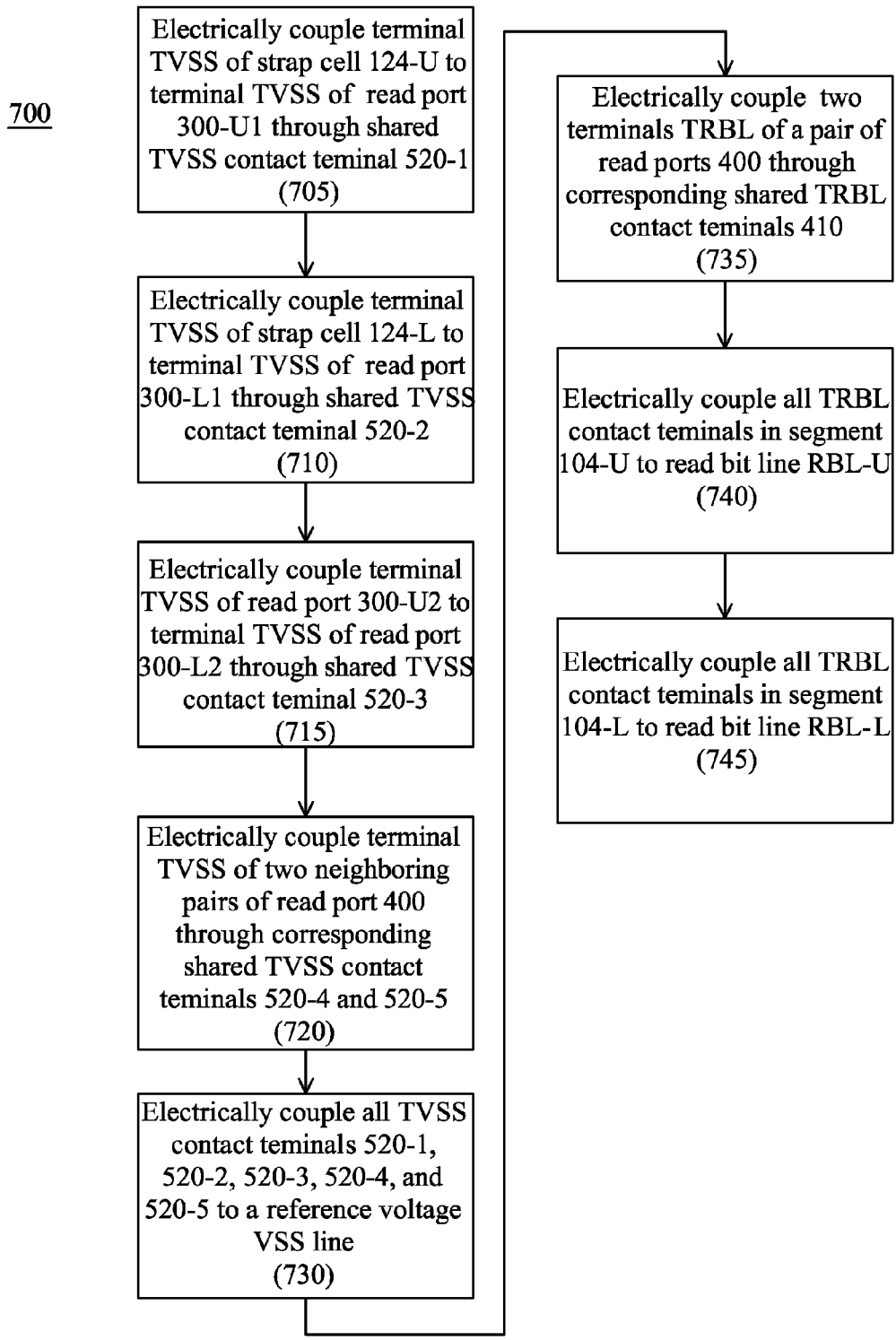
FIG. 7 is a flow chart of a method illustrating how a column is formed, in accordance with some embodiments.

FIG. 7 is a flow chart of a method 700 illustrating steps of forming column 120 in FIG. 5, in accordance with some embodiments.

In step 705, terminal TVSS of strap cell 124-U is electrically coupled to terminal TVSS of read port 300-U1 through a first shared TVSS contact terminal 520-1.

In step 710, terminal TVSS of strap cell 124-L is electrically coupled to terminal TVSS of read port 300-L1 through a second shared TVSS contact terminal 520-2.

In step 715, terminal TVSS of read port 300-U2 is electrically coupled to terminal TVSS of read port 300-L2 through a third shared TVSS contact terminal 520-3.

In step 720, terminals TVSS of two neighboring pairs of read ports 400 in column 120 are electrically coupled together through corresponding shared TVSS contact terminals 520-4 and 520-5.

In step 730, TVSS contact terminals 520-1, 520-2, 520-3, 520-4, and 520-5 in column 120 are electrically coupled to a reference voltage VSS line.

In step 735, two terminals TRBL of a pair of read port 400 are electrically coupled together through a corresponding shared TRBL contact terminal 410.

In step 740, TRBL contact terminals 410 in column 120 in segment 104-U are electrically coupled to read bit line RBL-U.

In step 745, TRBL contact terminals 410 in column 120 in segment 104-L are electrically coupled to read bit line RBL-L.

As a result of the steps 705 to 745, column 120 illustrated in FIG. 5 is formed.

Figure 8:
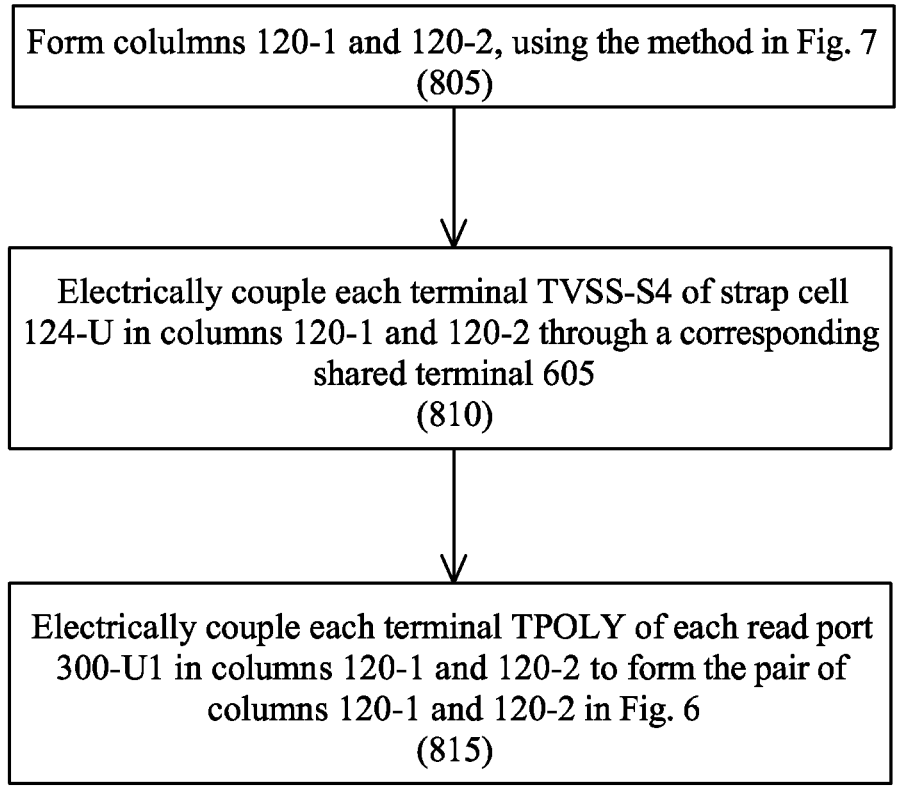
FIG. 8 is a flow chart of a method illustrating how two columns are connected, in accordance with some embodiments.

FIG. 8 is a flow chart of a method illustrating steps of forming a pair of columns 120-1 and 120-2 in FIG. 6, in accordance with some embodiments.

In step 805, two columns 120 in FIG. 5 are formed using the method of FIG. 7. For illustration the two columns are called 120-1 and 120-2.

In step 810, each terminal TVSS-S4 of each strap cell 124-U in column 120-1 and in column 120-2 is electrically coupled together through a corresponding shared TVSS contact terminal 605 as illustrated in FIG. 6.

In step 815, each terminal TPOLY of each read port 300-U1 in column 120-1 and in column 120-2 is electrically coupled together through a corresponding shared poly contact terminal, such as terminal 610 illustrated in FIG. 6.

A plurality of pairs of columns 120-1 and 120-2 in FIG. 6 are formed to form two segments 104-U and 104-L.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level (e.g., Low or High) of the various signals used in the above description is also for illustration purposes. Various embodiments are not limited to a particular level when a signal is activated and/or deactivated. Selecting different levels is within the scope of various embodiments.

In some embodiments, a semiconductor structure comprises a first strap cell, a first read port, and a first VSS terminal. The first strap cell has a first strap cell VSS region. The first read port has a first read port VSS region, a first read port read bit line region, and a first read port poly region. The first VSS terminal is configured to electrically couple the first strap cell VSS region and the first read port VSS region.

In some embodiments, a structure comprises a first segment and a second segment. The first segment includes a first strap cell and a plurality of first read ports. The second segment includes a second strap cell and a plurality of second read ports. A first strap cell VSS region of the first strap cell and a first read port VSS region of a first read port of the plurality of first read ports are electrically coupled together through a first VSS contact terminal. A second strap cell VSS region of the second strap cell and a second read port VSS region of a second read port of the plurality of second read ports are electrically coupled together through a second VSS contact terminal. A third read port VSS region of a third read port of the plurality of first read ports and a fourth read port VSS region of a fourth read port of the plurality of second read ports are electrically coupled together through a third VSS contact terminal.

In some embodiments, a first VSS contact terminal is configured to couple a first strap cell VSS region of a first strap cell and a first read port VSS region of a first read port. A first read bit line contact terminal is configured to couple a first read bit line region of the first read port to a first read bit line. A second VSS contact terminal is configured to couple a second strap cell VSS region of a second strap cell and a second read port VSS region of a second read port. A second read bit line contact terminal is configured to couple a second read bit line region of the second read port to a second read bit line. The first read bit line is different from the second read bit line.

The above methods show exemplary steps, but the steps are not necessarily performed in the order shown. Steps may be added, replaced, changed order, and/or eliminated as appropriate, in accordance with the spirit and scope of disclosed embodiments.

What is claimed is:

1. A semiconductor structure comprising:
   a first strap cell having a first strap cell reference voltage (VSS) region;
   a first read port having a first read port VSS region, a first read port read bit line region, and a first read port poly region; and
   a first VSS terminal configured to electrically couple the first strap cell VSS region and the first read port VSS region.

2. The semiconductor structure of claim 1 further comprising:
   a second strap cell having a second strap cell VSS region;
   a second read port having a second read port VSS region, a second read port read bit line region, and a second read port poly region; and
   a second VSS terminal configured to electrically couple the second strap cell VSS region and the second read port VSS region,
   wherein,
      the first VSS terminal and the second VSS terminal are electrically coupled together;
      the first read port belongs to a first segment of a memory macro; and the second read port belongs to a second segment of the memory macro.

3. The semiconductor structure of claim 2 further comprising:
a third read port belonging to the first segment;
a fourth read port belonging to the second segment; and
a third VSS contact terminal configured to couple a third read port VSS region of the third read port and a fourth read port VSS region of the fourth read port.

4. The semiconductor structure of claim 1, further comprising
a second read port having a second read port read bit line region; and
a first read bit line contact terminal configured to electrically couple the first read port read bit line region and the second read port read bit line region.

5. The semiconductor structure of claim 1, wherein
the first read port VSS region corresponds to a source region of a first transistor of the first read port;
the first read port read bit line region corresponds to a drain region of a second transistor of the first read port; and
the first read port poly region corresponds to a gate region of the second transistor.

6. The semiconductor structure of claim 1 further comprising
a second strap cell, the first strap cell belonging to a first column of a memory macro and the second strap cell belonging to a second column of the memory macro;
a first strap cell poly terminal configured to electrically couple a first strap cell poly region of the first strap cell and a second strap cell poly region of the second strap cell;
a second read port having a second read port poly region; and
a first read port poly terminal configured to electrically couple the first read port poly region of the first read port and the second read port poly region of the second read port.

7. The semiconductor structure of claim 6, wherein the first strap cell poly terminal is electrically coupled to the first VSS terminal.

8. The semiconductor structure of claim 1, wherein the first VSS terminal is electrically coupled to a VSS line through a first via between a diffusion area and a first metal layer, a second via between the first metal layer and a second metal layer, a third via between the second metal layer and a third metal layer, and a fourth via between the third metal layer and a fourth metal layer.

9. A structure comprising:
a first segment including
a first strap cell; and
a plurality of first read ports; and
a second segment including
a second strap cell; and
a plurality of second read ports,
wherein
a first strap cell reference voltage (VSS) region of the first strap cell and a first read port VSS region of a first read port belonging to the plurality of first read ports are electrically coupled together through a first VSS contact terminal;
a second strap cell VSS region of the second strap cell and a second read port VSS region of a second read port belonging to the plurality of second read ports are electrically coupled together through a second VSS contact terminal; and
a third read port VSS region of a third read port belonging to the plurality of first read ports and a fourth read port VSS region of a fourth read port belonging to the plurality of second read ports are electrically coupled together through a third VSS contact terminal.

10. The structure of claim 9, wherein
the first read port VSS region of the first read port corresponds to a source region of a first transistor of the first read port;
the first read port further includes a first read port read bit line region and a first read port poly region;
the first read port read bit line region corresponds to a drain of a second transistor of the first read port; and
the first read port poly region corresponds to a gate of the second transistor of the first read port.

11. The structure of claim 9, further comprising a VSS line configured to electrically connect the first VSS contact terminal, the second VSS contact terminal, and the third VSS contact terminal.

12. The structure of claim 9, wherein at least one of the first VSS contact terminal, the second VSS contact terminal, and the third VSS contact terminal is electrically coupled to a VSS line through a first via between a diffusion area and a first metal layer, a second via between the first metal layer and a second metal layer, a third via between the second metal layer and a third metal layer, and a fourth via between the third metal layer and a fourth metal layer.

13. The structure of claim 9, further comprising
a first read bit line configured to electrically couple a first read bit line terminal of the first read port and a third read bit line terminal of the third read port;
a second read bit line configured to electrically couple a second read bit line terminal of the second read port and a fourth read bit line terminal of the fourth read port.

14. The structure of claim 9, wherein
the first segment further includes
a third strap cell; and
a plurality of third read ports;
the second segment further includes
a fourth strap cell; and
a plurality of fourth read ports,
a third strap cell VSS region of the third strap cell and a fifth read port VSS region of a fifth read port of the plurality of third read ports are electrically coupled together through a fourth VSS contact terminal; and
a fourth strap cell VSS region of the fourth strap cell and a sixth read port VSS region of a sixth read port of the plurality of fourth read ports are electrically coupled through a fifth VSS contact terminal; and
a seventh read port VSS region of a seventh read port belonging to the plurality of third read ports and an eighth read port VSS region of an eighth read port belonging to the plurality of fourth read ports are electrically coupled together through a sixth VSS contact terminal.

15. The structure of claim 14, further comprising
a first strap cell poly terminal configured to electrically connect a first poly region of the first strap cell and a third poly region of the third strap cell;
a second strap cell poly terminal configured to electrically connect a second poly region of the second strap cell and a fourth poly region of the fourth strap cell;

a first read port poly terminal configured to electrically connect a first read port poly region of the first read port and a third read port poly region of the third read port; and a second read port poly terminal configured to electrically connect a second read port poly region of the second read port and a fourth read port poly region of the fourth read port.

16. The structure of claim 14, wherein the first strap cell poly terminal and the second strap cell poly terminal are electrically coupled together and to the first VSS contact terminal, the second VSS contact terminal, and the third VSS contact terminal.

17. A method comprising:
configuring a first reference voltage (VSS) contact terminal to couple a first strap cell VSS region of a first strap cell and a first read port VSS region of a first read port;

configuring a first read bit line contact terminal to couple a first read bit line region of the first read port to a first read bit line;

configuring a second VSS contact terminal to couple a second strap cell VSS region of a second strap cell and a second read port VSS region of a second read port; and configuring a second read bit line contact terminal to couple a second read bit line region of the second read port to a second read bit line different from the first read bit line.

18. The method of claim 17, wherein
a third read port VSS region of a third read port and a fourth read port VSS region of a fourth read port are electrically coupled together through a third VSS contact terminal;

a third read bit line region of the third read port is electrically coupled to the first read bit line through a third read bit line contact terminal; and a fourth read bit line region of the fourth read port is electrically coupled to the second read bit line through a fourth read bit line contact terminal.

19. The method of claim 17, further comprising
configuring a first poly contact terminal to couple a first read port poly region of the first read port to a third read port poly region of a third read port, wherein the first read port belongs to a first column of a memory macro and the third read port belongs to a second column of the memory macro.

20. The method of claim 17, wherein
a plurality of first read ports of a first segment of a memory macro are electrically coupled to the first read bit line; and a plurality of second read ports of a second segment of the memory macro are electrically coupled to the second read bit line.

* * * * *